United States Patent [19]

Butler et al.

[11] 4,117,353
[45] Sep. 26, 1978

[54] CONTROLLED CURRENT SINK

[75] Inventors: Walter J. Butler, Scotia; Charles W. Eichelberger, Schenectady, both of N.Y.

[73] Assignee: General Electric Company, Schenectady, N.Y.

[21] Appl. No.: 753,772

[22] Filed: Dec. 23, 1976

[51] Int. Cl.[2] .......................... H02J 1/04; H03K 1/12; G05F 1/56
[52] U.S. Cl. .................................. 307/297; 307/304; 323/4
[58] Field of Search ................ 307/297, 304; 323/1, 323/4, 22 R; 315/291, 224, 297, 307, 311; 330/277, 253

[56] References Cited

U.S. PATENT DOCUMENTS

| 3,875,430 | 4/1975 | Prak | 307/297 |
|---|---|---|---|
| 3,903,454 | 9/1975 | Matsui et al. | 315/291 X |
| 3,943,380 | 3/1976 | Morgan et al. | 307/297 X |
| 3,947,778 | 3/1976 | Hsiao et al. | 330/35 X |
| 3,995,177 | 11/1976 | Sirocka et al. | 307/297 X |
| 4,004,164 | 1/1977 | Cranford, Jr. et al. | 307/297 |
| 4,009,432 | 2/1977 | Dingwall et al. | 323/4 |
| 4,010,425 | 3/1977 | Dingwall et al. | 323/4 X |
| 4,020,367 | 4/1977 | Yamashiro et al. | 307/297 |
| 4,031,456 | 6/1977 | Shimada et al. | 323/4 |

OTHER PUBLICATIONS

Hoffman, "Constant-Current Source for MOSFET Circuits", IBM Tech. Discl. Bull., vol. 17, No. 8, pp. 2391; Jan. 1975.

Primary Examiner—Larry N. Anagnos
Attorney, Agent, or Firm—Marvin Snyder; Joseph T. Cohen

[57] ABSTRACT

A solid state cathode driver circuit for controllably sinking a current substantially independent of applied voltage includes a main current carrying transistor and first and second field effect transistors connected to a controlled electrode of the current carrying transistor for setting the potential on the control electrode substantially independent of the applied voltages to the controlled terminals. The magnitude of the sunk current is essentially determined by the geometry of the device utilized and is, therefore, essentially constant. Selective activation of the current sink is provided by grounding the control electrode to turn off the device.

6 Claims, 2 Drawing Figures

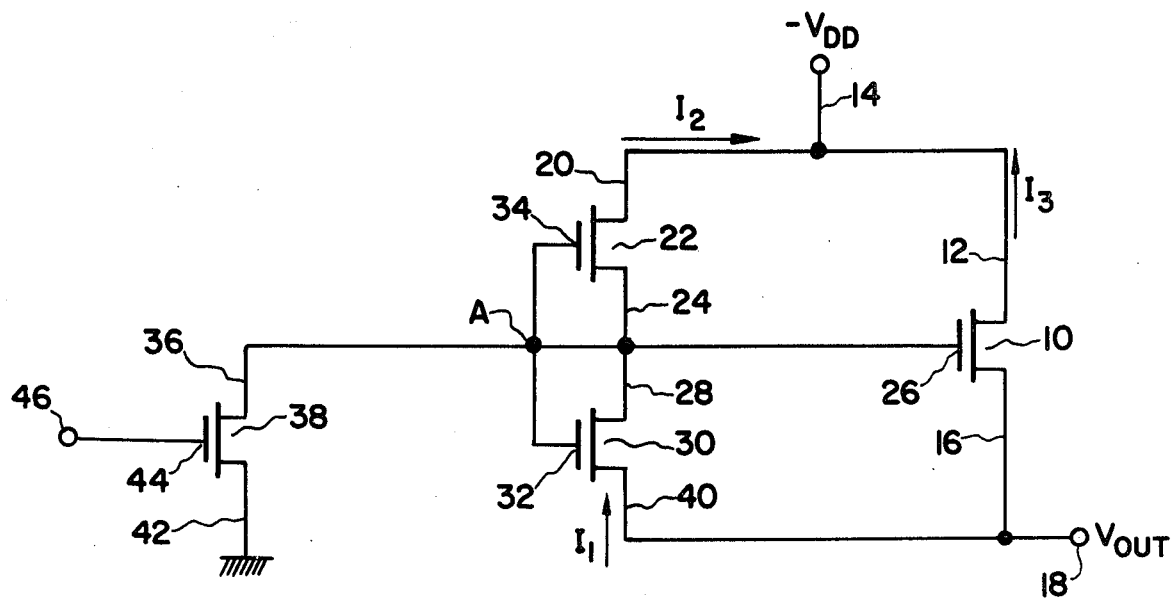

CONTROLLED CURRENT SINK

This invention relates, in general, to semiconductor current drivers and, more particularly, to a semiconductor cathode driver circuit especially adapted to be deployed in conjunction with gas discharge display devices.

As solid state control systems become increasingly prevelant, the need for display devices compatible with such control systems is apparent. Certain display devices, as for example, gas discharge or liquid crystal displays may advantageously be operated with integratable anode and cathode drive circuits. The cathode driver, with which this invention is concerned, is, in fact, a cathode current sink that is a current sink which is preferably operative to be turned on or off as required in order to provide, for example, desirable switching and/or multiplexing functions. It is required that a current sink be provided which is substantially insensitive to variations in both the supply voltage and the controlling voltage for providing the desired switching operations. Further, since in certain applications, many displays will be used, the device must be readily integratable in a relatively small area of a semiconductor device.

It is an object of this invention to provide a semiconductor cathode driver circuit which satisfies the foregoing requirements.

It is a further object of this invention to provide a versatile controllable constant current sink utilizing readily available components which may, if desired, be integrated and which may be utilized for a wide variety of applications.

BRIEF DESCRIPTION OF THE DRAWINGS

The features of the invention which are believed to be novel are pointed out with particularity in the appended claims. The invention itself, however, both as to its organization and method of operation together with further objects and advantages thereof may best be understood by reference to the following description taken in connection with the accompanying drawings in which:

FIG. 1 is a schematic diagram of a cathode driver circuit in accordance with one embodiment of this invention.

FIG. 2 is a view of an exemplary embodiment of this invention in monolithic and integrated circuit form.

BRIEF SUMMARY OF THE INVENTION

Briefly stated and in accordance with one aspect of this invention, controlled current sink includes a main current carrying transistor having first and second current carrying electrodes and a control electrode. A first enhancement mode field effect transistor is connected between the control electrode and the first current carrying electrode and a second, depletion mode, field effect transistor is connected between the control electrode and the second current carrying electrode. Each of the field effect transistors has a gate terminal which is connected to the control electrode of the main current carrying transistor, the juncture of the two gate terminals and the control electrode being connected to means for selectively grounding the control terminal to turn off the control current sink. In accordance with a presently preferred embodiment of this invention, the main current carrying transistor and the first and second field effect transistors are each metal-oxide-semiconductor transistors fabricated on a common semiconductor substrate.

DESCRIPTION OF THE PREFERRED EMBODIMENT

Referring now to FIG. 1, there will be seen a schematic diagram of a cathode driver circuit in accordance with one embodiment of this invention. Main current carrying transistor 10 (a depletion mode field effect transistor) is connected having drain electrode 12 connected to terminal 14 which is adapted to be connected to a source of supply voltage $-V_{DD}$. Source electrode 16 is connected to output terminal 18 which is labeled, for convenience, $V_{OUT}$. Terminal 14 is further connected to drain electrode 20 of transistor 22 which is a depletion mode field effect transistor. Source electrode 24 of transistor 22 is connected to gate electrode 26 of transistor 10 as well as to drain electrode 28 of transistor 30, gate electrode 32 of transistor 30, gate electrode 34 of transistor 22 and drain electrode 36 of transistor 38. Transistor 30 which is an enhancement mode field effect transistor includes source electrode 40 which is connected to source electrode 16 of transistor 10 both of which are connected as described to output terminal 18. Source electrode 42 of transistor 38 is connected to ground while gate electrode 44 thereof is connected to an input terminal 46 which is adapted to be connected to a source of control signals for the cathode driver circuit.

The operation of the circuit of FIG. 1 may be most readily understood by considering three currents which flow therein. A first current denominated I1 is the current flowing toward source electrode 40 of transistor 30. A second current I2 is the current flowing out of drain electrode 20 of transistor 22 and a third current I3 flows out of drain electrode 12 of transistor 10. The currents and the directions thereof which will be utilized in the following description of the operation of the circuit of FIG. 1 are illustrated by the arrows in the figure. The following description of the operation of the circuit of FIG. 1 assumes a p-channel implementation of the circuit of FIG. 1. While the circuit of FIG. 1 is especially advantageously fabricated in integrated circuit form, it will be understood that a fabrication thereof utilizing discrete semiconductor devices is within the scope of this invention and may in certain instances be desirable where, for example, only a limited number of such circuits is required. Further, it is preferable in accordance with this invention that the transistors utilized herein, transistors 10, 22, 30 and 38 be metal-oxide-semiconductor transistors. While MOS transistors are preferably utilized, it will be understood that the invention is not so limited and that other forms of transistors having the required current carrying capabilities and transfer characteristics may be employed. Those skilled in the art will appreciate that substitution of certain alternative transistors may require slight changes in the details of FIG. 1 in order to provide for operation in the desired portions of the operating characteristics of the devices employed. The addition of appropriate biasing resistors and the like is well known and understood and will not, therefore, be discussed here. The preferred embodiment of the invention illustrated in FIG. 1 is especially advantageously employed in an integrated circuit insofar as a minimum number of components is employed to provide the required function along with the advantages of this invention.

The circuit of FIG. 1 is operative to provide current sinking action when transistor 38 is turned off. This is accomplished by the application of an appropriate signal to gate electrode 44 through input terminal 46. In the case of a p-channel implementation a zero volt signal may advantageously be employed. When transistor 38 is turned off, node A which is the juncture of drain electrode 36 of transistor 38, gate electrodes 32 and 34 of transistors 30 and 22 respectively, drain electrode 28 of transistor 30, source electrode 24 of transistor 22 and gate electrode 26 of transistor 10 is isolated. This causes current I1 to equal current I2. Current I1 through enhancement mode transistor 30 is expressed as $$I_1 = k(W/L)_1 (V_A - V_{out} - V_{T_1})^2 \qquad (1)$$

wherein $k$ is a constant determined by the characteristics of device 30, $W$ and $L$ are the width and length respectively of the channel of device 30, $V_A$ is the voltage at node A, $V_{out}$ is the voltage at terminal 18 and $V_{T_1}$ is the threshold voltage of transistor 30. Similarly, current I2 may be expressed as $$I_2 = k(W/L)_2 (-V_{T_2})^2 \qquad (2)$$

wherein the quantities are as indicated in equation (1) except that $(W/L)_2$ is the width-to-length ratio for transistor 22 and $V_{T_2}$ is the threshold voltage for device 22. Since I1 = I2, it will be appreciated that if $(W/L)_1 = (W/L)_2$ then $V_A = V_{out} + V_{T_1} - V_{T_2}$.

The current in transistor 10 which is preferably a depletion mode transistor in accordance with this invention is given by $$I_3 = k(W/L)_3 (V_A - V_{out} - V_{T_3})^2 \qquad (3)$$

wherein $I_3$ is as indicated on the figure, and the other quantities are as hereinabove described except that $(W/L)_3$ is the width-to-length ratio of transistor 10 and $V_{T_3}$ is the threshold voltage of transistor 10. Substituting for $V_A - V_{out}$ from the solution to equaltions (1) and (2) yields $$I_3 = k(W/L)_3 (V_{T_1} - V_{T_2} - V_{T_3})^2 \qquad (4)$$

This is the current flowing in transistor 10 when the control voltage to transistor 38 is zero volts and transistor 38 is turned off. It will be appreciated that the current is independent of the output voltage to a reasonable extent, it being understood that the threshold volages $V_{T_1}$ and $V_{T_3}$ are functions of $V_{out}$ due to the back-gate bias effect. This dependence of $V_{T_1}$ and $V_{T_3}$ on $V_{out}$ is relatively insignificant, however. The current is also insensitive to $V_{DD}$ and to the magnitude of the control input voltage so long as transistor 38 is turned off.

The circuit of FIG. 1 is turned off by the application of a negative voltage to gate electrode 44 of transistor 38. Transistor 38 is preferably designed to have a width-to-length ratio greater than that of transistor 22 such that when transistor 38 is turned on, the voltage at node A is sufficiently close to ground that transistor 10 is allowed to turn off.

An arrangement for fabricating the circuit of FIG. 1 in monolithic integrated circuit form is illustrated at FIG. 2. The MOS implementation of FIG. 2 is especially well suited for fabrication of the circuit of FIG. 1 in accordance with a presently preferred embodiment of this invention. In accordance with FIG. 2, dashed regions are aluminum electrodes, the empty solid outlined regions are semiconductor regions of opposite impurity type with the substrate which is illustrated as the solid wavy overall outline; the shaded regions are thin oxide layers and the cross-hatched region is an ion implanted channel. Contact holes are indicated by boxed x's and the important dimensions are illustrated in the conventional fashion. The device of FIG. 2 is a p-channel semiconductor device, it being understood that where desired n-channel fabrication techniques may be utilized. Referring now to FIG. 2, wherein, where possible, like reference numerals with FIG. 1 are utilized to designate like elements, four transistors are apparent. Transistor 38 includes drain diffusion 50, source diffusion 52 and channel 54 therebetween. Electrode 42 contacts diffusion 52 through contact hole 56 while electrode A contacts diffusion 50 through contact hole 58. Gate electrode 44 overlying channel 54 and is effective in the area of thin oxide region 60. It will be understood that while not illustrated, the aluminum metallization regions of the device of FIG. 2 are, except where thin oxide or contact holes are present, assumed to overlie a relatively thick oxide layer which generally covers the entire device. Transistor 22 includes area 20 of p-conductivity type region 62, the full extent of which will be described hereinbelow, ion implanted region 64 and the upper portion of p-conductivity type region 66. The significant dimensions of transistor 22, $L_2$ and $W_2$ are as indicated on the drawing. The lower portion of p-conductivity type region 66 along with p-conductivity type region 40 and the channel therebetween form transistor 30. Region 40, as expected, also forms the source of transistor 10 the drain of which is formed by portion 68 of the large diffusion 62. The dimensions of transistors 30 and 10 the importance of which has been extensively described hereinabove, $W_1$, $L_1$, $W_3$ and $L_3$ are as illustrated in the figure. Output 18 is provided through contact hole 70 region 40 while contact hole 72 provides connection to voltage source $-V_{DD}$. It will be understood by those skilled in the art that the structure of FIG. 2 is preferably provided on a semiconductor chip including other components and that the various inputs and outputs thereof are therefore routed to be appropriately connected. For example, input terminal 46 is preferably connected to logic circuit for the control of the circuit.

While the present invention has been described with reference to several preferred embodiments thereof, many variations and modifications will now become apparent to those skilled in the art. It is my intent, therefore, to be limited not by the scope of the present disclosure herein, but only by the scope of the appending claims.

What is claimed is:

1. A controlled current sink comprising:
    a main current carrying depletion mode field effect transistor having first and second current carrying electrodes and a control electrode for regulating the amount of current flowing through said current carrying electrodes of said main current carrying transistor;
    a first enhancement mode field effect transistor connected between said control electrode and said first current carrying electrode of said main current carrying transistor;
    a second depletion mode field effect transistor connected between said control electrode and said second current carrying electrode of said main current carrying transistor; said first enhancement mode field effect transistor and said second depletion mode field effect transistor each including a gate terminal, said gate terminals connected directly together and connected directly to said control electrode of said main current carrying transistor; and field effect transistor means for selectively grounding said control electrode of said main current carrying transistor, said field effect transistor means including a drain electrode connected directly to said gate terminals and said control electrode.

2. The controlled current sink of claim 1 wherein said main current carrying transistor comprises a field effect transistor, said first and second current carrying electrodes comprising the source and drain electrodes, respectively of said field effect transistor and said control electrode comprising the gate of said field effect transistor.

3. The controlled current sink of claim 2 wherein said main current carrying field effect transistor comprises a metal-oxide-semiconductor field effect transistor.

4. The controlled current sink of claim 3 wherein said first enhancement mode field effect transistor comprises a metal-oxide-semiconductor field effect transistor and said second depletion mode field effect transistor comprises a metal-oxide-semiconductor field effect transistor.

5. The controlled current sink of claim 4 wherein said field effect transistor means for selectively grounding said control electrode comprises a metal-oxide-semiconductor field effect transistor having drain, source and gate electrode, said drain electrode connected to said control electrode of said main current carrying transistor, said source electrode connected to ground, and said gate electrode connected to a source of control signals.

6. The controlled current sink of claim 1 wherein said first enhancement mode field effect transistor comprises a metal-oxide-semiconductor field effect transistor and said second depletion mode field effect transistor comprises a metal-oxide-semiconductor field effect transistor.

* * * * *